(12) United States Patent
Teranishi

(10) Patent No.: US 11,092,824 B2
(45) Date of Patent: Aug. 17, 2021

(54) METHOD OF CONTROLLING SEMICONDUCTOR OPTICAL AMPLIFIER AND OPTICAL AMPLIFYING APPARATUS

(71) Applicant: SUMITOMO ELECTRIC DEVICE INNOVATIONS, INC., Yokohama (JP)

(72) Inventor: Ryota Teranishi, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 477 days.

(21) Appl. No.: 16/038,652

(22) Filed: Jul. 18, 2018

(65) Prior Publication Data
US 2019/0025614 A1  Jan. 24, 2019

(30) Foreign Application Priority Data

Jul. 19, 2017 (JP) .............................. JP2017-139917

(51) Int. Cl.
| | |
|---|---|
| *G02F 1/01* | (2006.01) |
| *H01S 5/50* | (2006.01) |
| *H04B 10/291* | (2013.01) |
| *H04B 10/524* | (2013.01) |
| *H04B 10/54* | (2013.01) |
| *H04B 10/293* | (2013.01) |
| *H01S 5/0683* | (2006.01) |
| *H01S 5/00* | (2006.01) |

(52) U.S. Cl.
CPC .......... *G02F 1/0121* (2013.01); *H01S 5/0683* (2013.01); *H01S 5/50* (2013.01); *H04B 10/293* (2013.01); *H04B 10/2914* (2013.01); *H04B 10/524* (2013.01); *H04B 10/541* (2013.01); *G02F 2203/48* (2013.01); *H01S 5/0085* (2013.01)

(58) Field of Classification Search
CPC . H01S 5/0683; H01S 5/06832; H04B 10/673; H04B 10/674; G02F 10/0121
See application file for complete search history.

(56) References Cited

U.S. PATENT DOCUMENTS

| | | | |
|---|---|---|---|
| 10,033,161 B2* | 7/2018 | Teranishi | H01S 5/0683 |
| 2004/0062557 A1* | 4/2004 | Takashima | H04B 10/674 |
| | | | 398/209 |
| 2020/0213011 A1* | 7/2020 | Tanaka | H04B 10/27 |

FOREIGN PATENT DOCUMENTS

JP   H9-224016   8/1997

OTHER PUBLICATIONS

Chan and Way, "112 GB/s PAM4 Transmission Over 40km SSMF Using 1.3 m Gain-Clamped Semiconductor Optical Amplifier", Optical Fiber Communication Conference OSA Technical Digest (online) (Optical Society of America, 2015), paper Th3A.4. (Year: 2015).*

* cited by examiner

*Primary Examiner* — Eric L Bolda
(74) *Attorney, Agent, or Firm* — Smith, Gambrell & Russell, LLP.

(57) ABSTRACT

A method of controlling an optical amplifying system that processes an optical signal with the PAM4 mode is disclosed. The optical amplifying system includes a variable optical attenuator (VOA) and a semiconductor optical amplifier (SOA). The VOA attenuates the optical signal such that a maximum optical power thereof corresponding to one of the physical levels of the PAM4 signal becomes equal to a preset optical level for which the SOA may be linearly operable. The SOA may amplify the thus attenuated optical signal with a fixed optical gain.

7 Claims, 8 Drawing Sheets

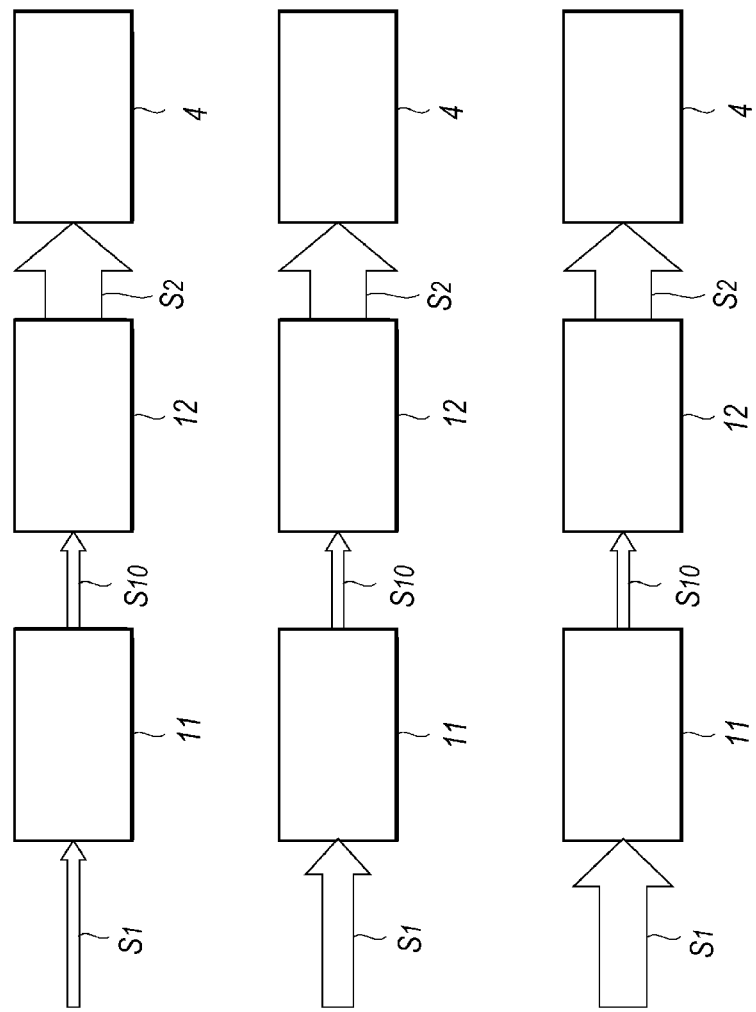

METHOD OF CONTROLLING SEMICONDUCTOR OPTICAL AMPLIFIER AND OPTICAL AMPLIFYING APPARATUS

CROSS REFERENCE TO RELATED APPLICATION

The present application is based on and claims the benefit of priority of Japanese Patent Application No. 2017-139917, filed on Jul. 19, 2017, the entire content of which is incorporated herein by reference.

BACKGROUND OF INVENTION

1. Field of Invention

The present invention relates to a method of controlling a semiconductor optical amplifier (SOA) and an optical amplifying apparatus.

2. Background Arts

Optical amplifying apparatus that include an optical amplifier such as semiconductor optical amplifier (SOA) are sometimes implemented between optical apparatus in an optical communication system. Such an optical amplifier detects an optical signal entering therein and adjusts an optical gain thereof so as to output an amplified optical signal with designed optical power, which is often called as the automatic power control (APC). The optical signals entering therein has optical power dependent on various conditions, for instance, a distance from an optical transmitter or an optical relay station, time degradation of optical and electrical components in the system, and so on. Accordingly, the optical amplifying apparatus often attenuates the optical signal entering therein then amplifies the attenuated optical signal to set power of the amplified optical signal within a preset range.

A Japanese patent document laid open No. JP-H09-224016A has disclosed an optical amplifying apparatus that includes optical attenuators, an optical coupler, and an optical amplifier. The optical attenuators attenuate optical signals to designed power, the optical coupler wavelength-multiplexes the attenuated optical signals, and the optical amplifier amplifies thus multiplexed optical signal with a preset gain. In the optical amplifying apparatus disclosed therein, the attenuators attenuate the optical signals depending on a level of the amplified signal. When an optical amplifying apparatus implements a semiconductor optical amplifier (SOA) as the optical amplifier, an SOA inherently shows non-linearity in an optical gain thereof. Specifically, an SOA generally shows a constant optical gain for an input optical signal with relatively smaller power but an output signal in optical power thereof gradually saturates for an input optical signal with relatively greater power. When an input optical signal is modulated by a mode of, for instance, pulse amplitude modulation (PAM) with four (4) levels or more, differences between levels become substantial. In order to recover data contained in an optical signal modulated with the PAM-n mode, the differences between the levels neighbor to each other are necessary to be substantially identical to each other.

SUMMARY

An aspect of the present invention relates to a method of controlling an optical amplifying apparatus. The optical amplifying apparatus of the invention receives an optical signal having four or more physical levels following a pulse amplitude modulation (PAM) mode, and includes a variable optical attenuator (VOA) and a semiconductor optical amplifier (SOA). The method of the invention includes steps of: (a) generating an attenuated optical signal by attenuating the optical signal entering therein such that the attenuated optical signal in maximum power of one of the physical levels of the PAM mode becomes preset power for which the SOA is linearly operable; and (b) amplifying the attenuated optical signal by the SOA with an optical gain, preferably a fixed optical gain.

BRIEF DESCRIPTION OF THE DRAWINGS

The foregoing and other purposes, aspects and advantages will be better understood from the following detailed description of a preferred embodiment of the invention with reference to the drawings, in which:

FIG. 4A to FIG. 4C show mechanisms to set the attenuation in the VOA and the optical gain in the SOA according to the present invention;

DETAILED DESCRIPTION

Next, some embodiments according to the present invention will be described as referring to accompanying drawings. The present invention, however, is not restricted to those embodiments, but has a scope defined in appended claims and all modification and changes made within the scope and equivalents thereto. In the description of the drawings, numerals or symbols same with or similar to each other will refer to elements same with or similar to each other without duplicating explanations.

Figure 1:
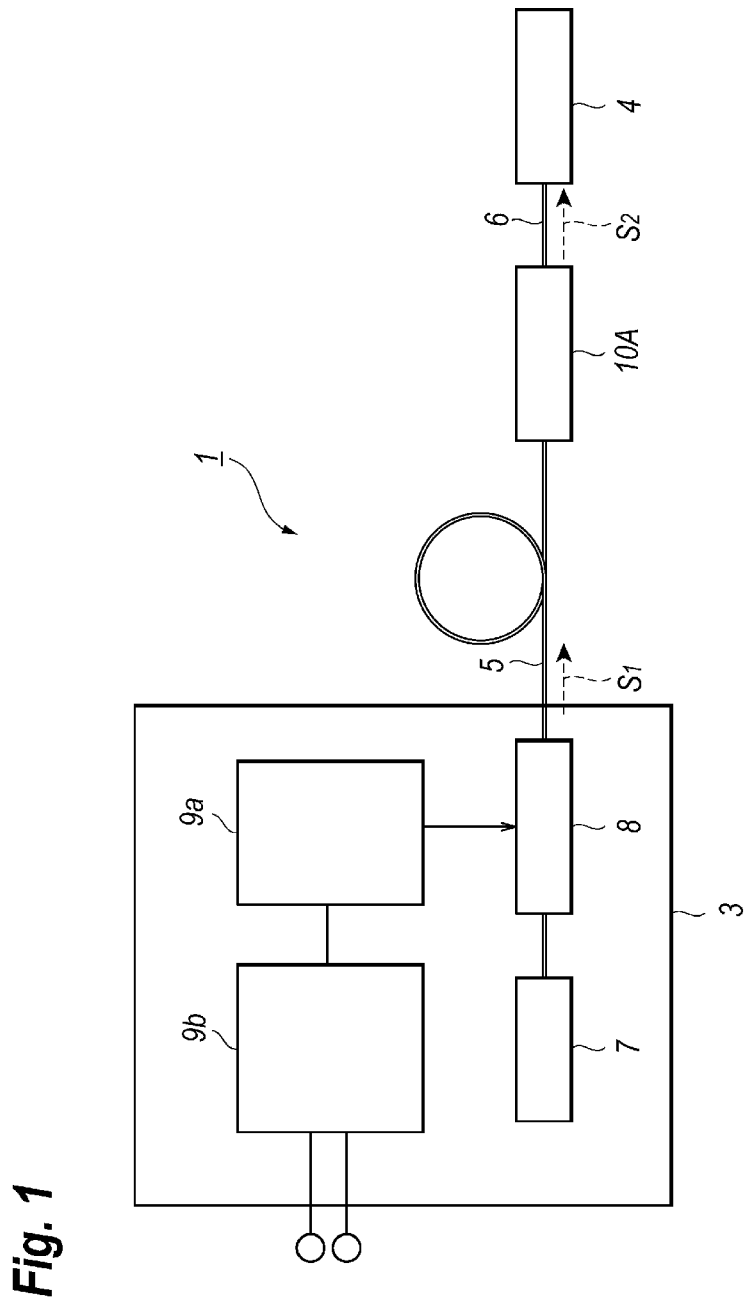
FIG. 1 schematically shows a functional block diagram of an optical communication system implementing an optical signal with the pulse amplitude modulation (PAM) mode.

FIG. 1 schematically shows a functional block diagram of an optical communication system 1 that implements an optical amplifying apparatus 10A according to an embodiment of the present invention. The optical communication system 1 includes an optical transmitter 3, an optical receiver 4, and an optical amplifying apparatus 10A. The optical receiver 4, or the optical amplifying apparatus 10A, is installed apart from the optical transmitter 3 interposing with an optical fiber 5 with a length of, for instance, 80 km or longer. Another optical fiber 6 that has a length far shorter than that of the optical fiber 5 couples the optical amplifying apparatus 10A with the optical receiver 4. The optical transmitter 3 may output an optical signal $S_1$ modulated with, for instance, the PAM4 mode, where the PAM4 mode includes four (4) physical levels corresponding to two bits two-bit data. The optical amplifying apparatus 10A receives this optical signal $S_1$ through the optical fiber 5 that generally causes an optical loss and optically amplifies the attenuated optical signal $S_1$ to provide an amplified optical signal $S_2$ to the optical receiver 4 through the optical fiber 6.

The optical transmitter 3 generally includes an optical source 7, an optical modulator 8, a driver 9a, and a signal processor 9b. The optical source 7, which may be a continuous wave (CW) source, typically, non-modulated laser diode (LD), may generate a CW laser beam with a specific wavelength. The optical modulator 8, which may be an electro-absorption (EA) modulator and optically couples with the optical source 7, modulates the CW laser beam by a driving signal provided from the driver 9a, where the driving signal is modulated with the PAM mode. The modulated laser beam output from the optical modulator 8 enters the optical fiber 5 as the optical signal $S_1$ that is modulated with the mode of the four-level pulse-amplitude-modulation (PAM4).

Figure 2B:
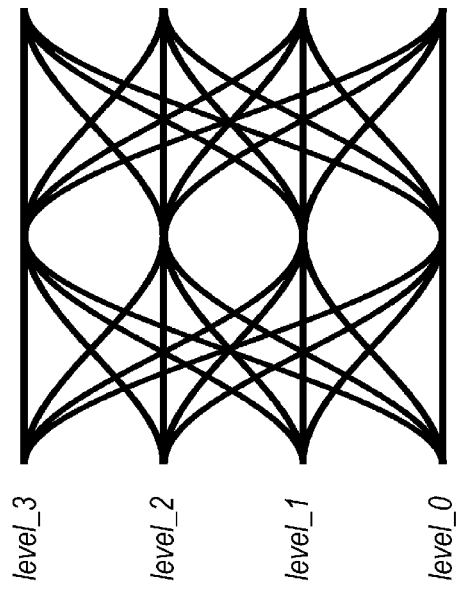
FIG. 2A and FIG. 2B compares eye-diagrams of optical signals with the PAM4 mode processed by the optical amplifying apparatus of the invention and a conventional optical amplifying apparatus, respectively.
Figure 2A:
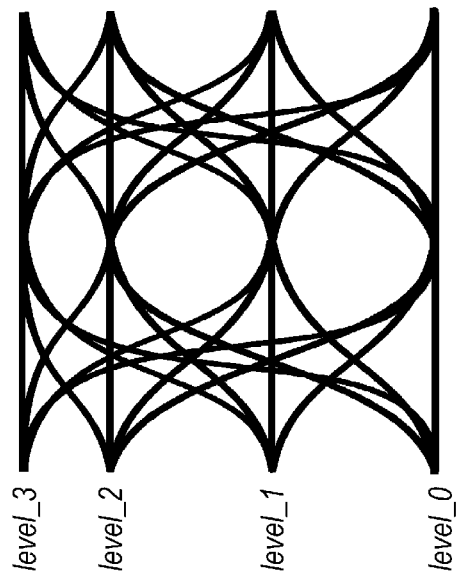

FIG. 2A and FIG. 2B compares eye-diagrams of optical signals having the PAM4 mode processed by the optical amplifying apparatus of the invention and a conventional optical amplifying apparatus, respectively. The PAM4 signal includes four (4) physical levels, level_0 to level_3, that correspond to data of "00", "01", "10", and "11", in binary logic, respectively. That is, the optical signal with the PAM4 mode has double degeneracy. When a PAM4 signal has a level difference between, for instance, the level_0 and the level_1, that is different from a level difference between, for instance, the level_2 and the level_3, at an optical receiver, as shown in FIG. 2B, which increases erroneous recovery of data between "10" and "11" compared with data between "00" and "01", the optical communication system implementing the PAM4 mode degrades the reliability or the exactness of recovered data.

Referring to FIG. 1 again, the driver 9a, which electrically couples with the modulator 8, provides the driving signal with the PAM4 mode to the modulator 8. The signal processor 9b converts two bit binary data externally provided to the optical transmitter 3 into a signal with the PAM4 mode, that is, the signal with four levels. The input data has a symbol rate of 1 data per symbol, while, a signal with the PAM4 mode has a symbol rate of 2 data per symbol. Accordingly, the signal with the PAM4 mode is enough to have a speed just half of that of the input signal. However, given a continuous request to enhance the transmission speed in an optical communication system, the optical transmitter 3 is necessary to be operable in a speed closer to the data rate of the input binary signal, which means that a lack of external binary data occurs. In such a case, the signal processor may generate a PAM4 signal as interposing redundant data to make a signal with the PAM4 mode synchronizing with the external binary data.

The optical receiver 4 may receive an optical signal $S_1$ output from the optical transmitter 3 through the optical amplifying apparatus 10A. The optical receiver 4 may recover data contained in the optical signal $S_2$ amplified by the optical amplifying apparatus 10A and converts the signal $S_2$ into two bit binary data.

Figure 3:
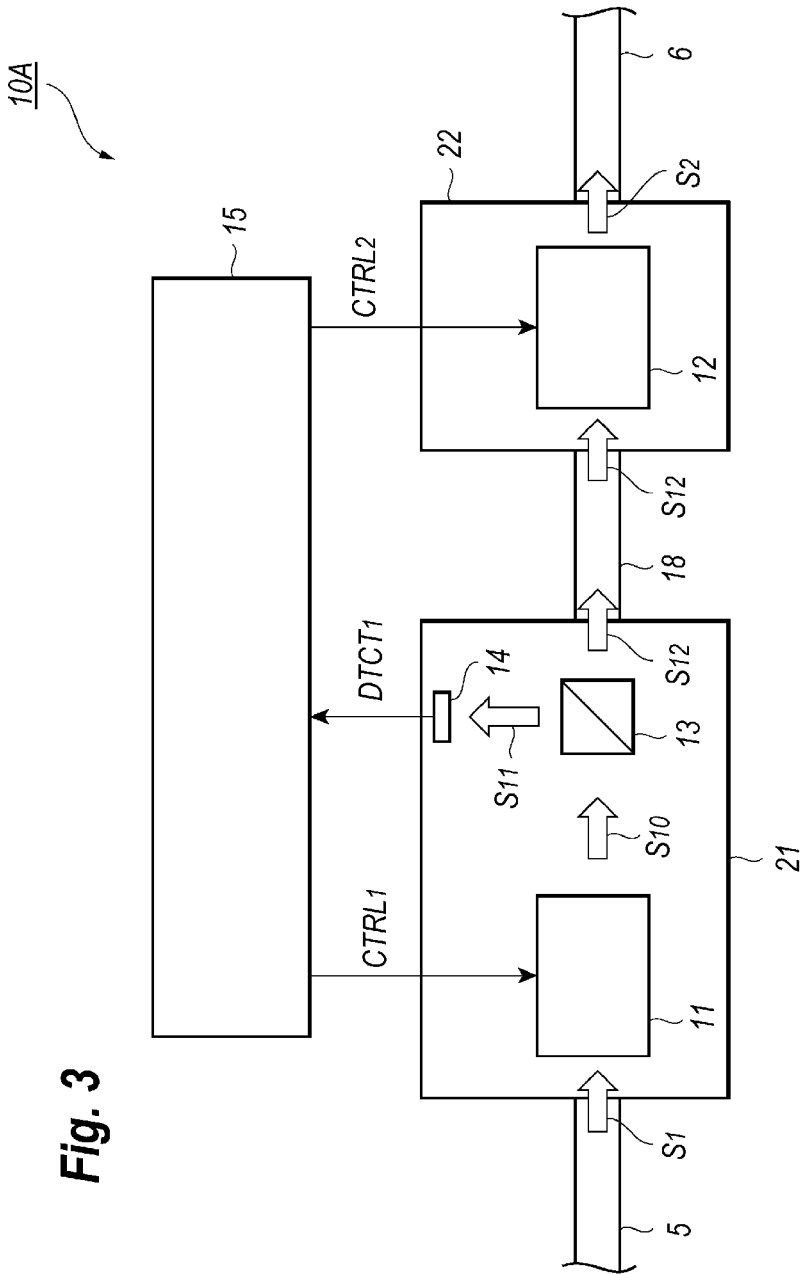
FIG. 3 schematically illustrates a functional block diagram of an optical amplifying apparatus according to the first embodiment of the present invention.

FIG. 3 shows a functional block diagram of the optical amplifying apparatus 10A according to an embodiment of the present invention. The optical amplifying device 10A of the present embodiment includes a variable optical attenuator (VOA) 11, a semiconductor optical amplifier (SOA) 12, an optical splitter 13, an optical detector 14, and a controller 15. The VOA 11 optically couples with an end of the optical fiber 5; while, the SOA 12 is optically coupled with the VOA 11 through an optical fiber 18. The SOA 12 may optically couple with the optical receiver 4 through the optical fiber 6. Optical couplings between the VOA 11 and the SOA 12 and between the SOA 12 and the optical fiber 6 may be done through respective optical connectors.

The VOA 11 receives the optical signal $S_1$ from the optical fiber 5 and attenuates the optical signal $S_1$. The controller 15 may adjust attenuation in the VOA 11 through a control signal $CTRL_1$. The SOA 12 may receive an attenuated optical signal $S_{10}$, exactly, an optical signal $S_{12}$ attenuated by the VOA 11 and split by the optical splitter 13, and may optically amplify thus receiving optical signal $S_{12}$ to generate the amplified optical signal $S_2$. The controller 15 may adjust an optical gain set in the SOA 12 through another control signal $CTRL_2$.

The optical splitter 13, which is interposed between the VOA 11 and the SOA 12, may split the attenuated optical signal $S_{10}$ into two optical signals, $S_{11}$ and $S_{12}$, where the latter optical signal $S_{12}$ enters the SOA 12 through the optical fiber 18 as described above; while, the former optical signal $S_{11}$ enters the optical detector 14. The optical splitter 13 has a split ratio for the optical signal $S_{11}$ of 3 to 30% against the optical signal $S_{10}$. The optical detector 14 may detect power, exactly average power, of the attenuated optical signal $S_{10}$ through the optical signal $S_{11}$ and generates an electrical signal $DTCT_1$ that is provided to the controller 15. The optical detector 14 may be a photodiode (PD). The present embodiment encloses the VOA 11, the optical splitter 13 and the optical detector 14 within a common housing 21, while, the SOA 12 is enclosed within another housing 22.

The controller 15 may generate control signals, $CTRL_1$ and $CTRL_2$, to control the attenuation in the VOA 11 and the optical gain in the SOA 12, respectively. Specifically, the controller 15 may control the attenuation of the VOA 11 based on the detected signal $DTCT_1$ provided from the optical detector 14 such that the optical signal $S_{10}$ in maximum power thereof, which corresponds to the data "11", keeps a target power, for which the SOA 12 may be linearly operable. Also, the controller 15 may fix the optical gain in the SOA 12 in a preset gain through the control signal $CTRL_2$. The controller 15 may be a micro-controller implementing a central processing unit (CPU) and a memory.

FIG. 4A to FIG. 4C schematically show algorithms to set the attenuation in the VOA 11 and the optical gain in the SOA 12, where power of the optical signal $S_1$ is denoted by sizes of arrows. That is, FIG. 4A to FIG. 4C show statuses where the optical signal has smaller power, medium one, and a greater one, respectively. Next, a method of controlling the optical amplifying apparatus shown in FIG. 3 will be described as referring to FIG. 4A to FIG. 4C.

First of all, the VOA 11 receives the optical signal $S_1$. Thereafter, the controller 15 adjusts the attenuation in the VOA 11 such that the optical signal $S_{10}$ output from the VOA 11 in maximum thereof becomes less than the preset power independent of the power of the input signal $S_1$, where the preset power makes the SOA 12 linearly operable. Specifically, when the input signal $S_1$ in the average power thereof is relatively smaller, the attenuation in the VOA 11 is set smallest, or substantially no attenuation, as shown in FIG. 4A. When the input signal $S_1$ has medium power, the attenuation in the VOA 11 is set in medium (FIG. 4B), and the input signal $S_1$ has greater power, the attenuation is the VOA 11 is set in maximum (FIG. 4C). Thus, the attenuated signal $S_{10}$ output from the VOA 11 in the average power thereof becomes constant independent of the average power of the input signal.

When an optical signal is with the PAM4 mode, the optical communication system implementing the PAM4 mode in the modulation algorithm thereof strictly defines the respective power levels at the output in the optical transmitter 3. Also, the appearing probability probabilities of respective levels, 0 to 3, are set substantially equal to each other. Accordingly, the controller 15 in the optical amplifying apparatus 10A may estimate the maximum power of the attenuated optical signal $S_{10}$ through the output of the optical detector 14 even when the optical detector 14 may sense only an average of the attenuated optical signal $S_{10}$. The controller 15 first sets the VOA 11 in substantially no attenuation, then, receives the average power of the optical signal $S_{10}$ from the optical detector 14. Thereafter, the controller 15 may evaluate optical loss from the optical transmitter 3 to the optical amplifying system 10A by comparing the detected average power of the optical signal $S_{10}$ with the average power at the optical transmitter 3 that is defined in the specification, and estimate the maximum power of the optical signal $S_{10}$ corresponding to the level 3 by adding a half of the amplitude of the optical signal $S_{10}$ which is estimated from the amplitude defined in the specification and the optical loss in the system. Thus, the controller 15 may set the VOA 11 such that the maximum power of the optical signal $S_{10}$ thus estimated becomes the preset power, which is within a range where the SOA 12 may perform the linear operation.

Then, the controller 15 sets the optical gain in the SOA 12. In the present embodiment, because the optical signal $S_{10}$ in the average power thereof is set constant such that the maximum power for the level 3 becomes the preset power that is within the range of the linear operation in the SOA 12, the controller 15 sets a constant optical gain in the SOA 12.

Figure 5A:
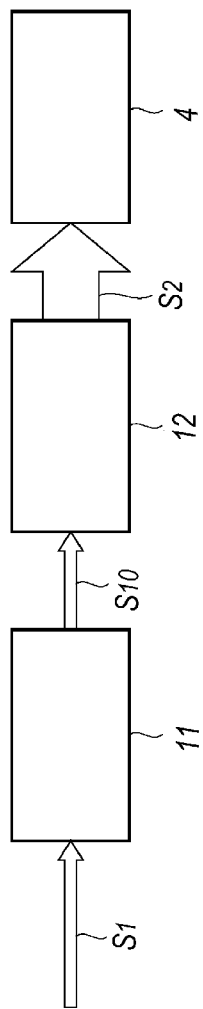
FIG. 5A to FIG. 5C show statuses of optical signals in a conventional mechanism of the VOA and the SOA.
Figure 5B:
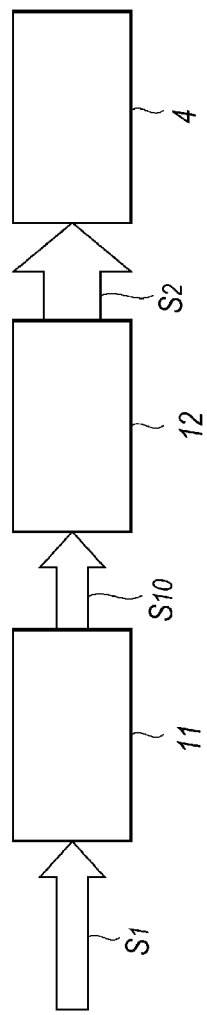
Figure 5C:
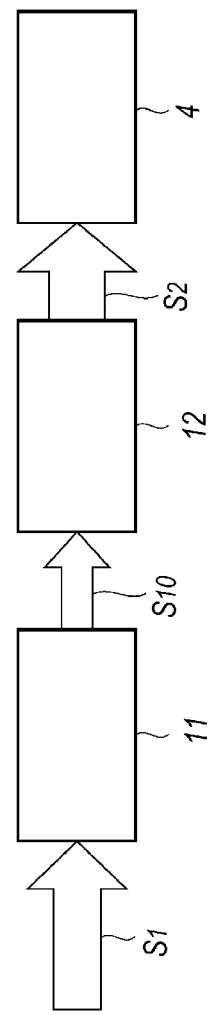

Next, advantages according to the present embodiment will be described as referring to FIG. 5A to FIG. 5C which show status of optical signals in a conventional configurations of the VOA 11 and the SOA 12. When the input signal $S_1$ has optical power relatively smaller, the VOA 11 in the attenuation thereof is minimum, or substantially zero and the SOA 12 in the optical gain thereof is set maximum (FIG. 5A). When the optical signal $S_1$ in average power thereof is medium, the VOA 11 in the attenuation thereof is still set zero but the optical gain in the SOA 12 is set in medium (FIG. 5B), which is smaller than that in the status shown in FIG. 5A. Lastly, when the optical signal in the power thereof is large, the attenuation in the VOA 11 is set substantially such that the SOA 12 may show an amplifying operation for the optical signal $S_{10}$ attenuated by the VOA 11 (FIG. 5C).

Figure 6:
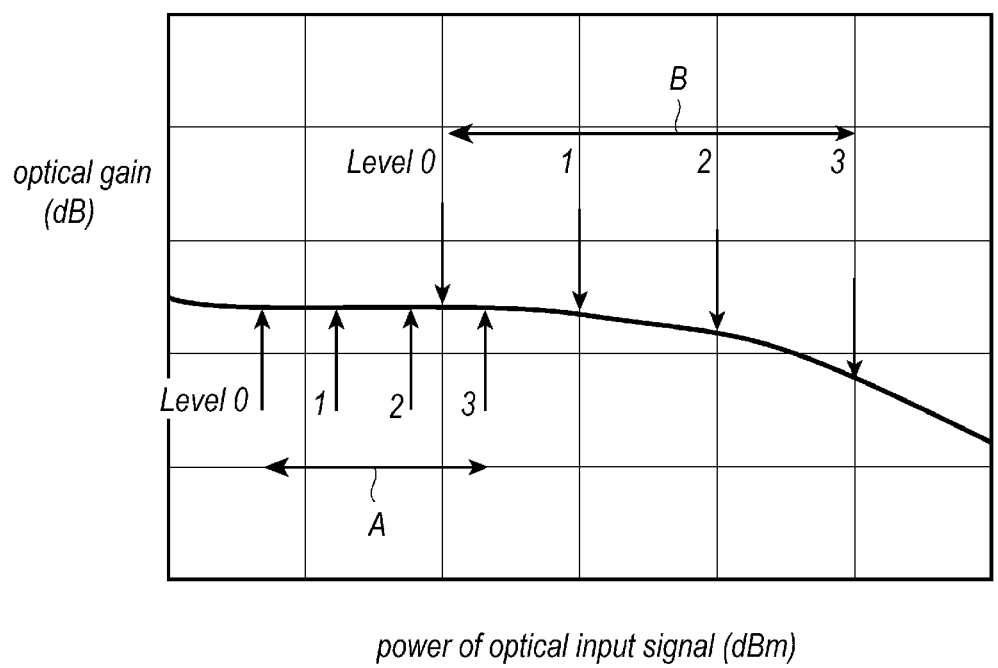
FIG. 6 shows a relation of power of an optical input signal for the SOA 12 and an optical gain thereof accompanying with optical levels for an optical signal with the PAM4 mode.

FIG. 6 shows a relation of optical power of an input signal for the SOA 12 and an optical gain thereof. A horizontal axis corresponds to optical power of the input signal in a unit of dBm, while, a vertical axis shows an optical gain of an SOA. A general semiconductor optical amplifier shows an optical gain substantially constant for an optical input signal with relatively smaller power; but, the optical gain decreases in optical signals with greater power. When the four levels of an optical signal with the PAM4 mode are within a range A of relatively smaller power, the levels, 0 to 3, may be evenly amplified. However, when the four levels, 0 to 3, are in another range B, where the power for the greater levels, 2 and 3, enters a range where the optical gain decreases; the four levels, 0 to 3, are unevenly amplified.

Accordingly, even when the optical signal $S_1$ shows the eye-diagram shown in FIG. 2A where the four levels, 0 to 3, are evenly distributed; the optical signal $S_2$ output from the SOA 12 in the eye-diagram thereof becomes that shown in FIG. 2B; that is, a difference between the higher two levels, 2 and 3, is shrunk compared with other two differences, which may possibly increase conversion errors between the two levels, 2 and 3, corresponding to data "10" and "11", and degrade the error rate in the optical communication system.

On the other hand in the present embodiment, the controller 15 adjusts the attenuation in the VOA 11 such that the optical signal $S_{10}$ in the maximum power thereof corresponding to the level 3 is within the preset power independent of the power of the input optical signal $S_1$ entering the VOA 11, where the SOA 12 may be linearly operable. Thus, the SOA 12 may amplify the respective optical levels, 0 to 3, within the linearly operable range in the optical gain thereof, namely, in the range A shown in FIG. 6. The method of the present embodiment for controlling the optical amplifying apparatus including an SOA may amplify the optical signal with the PAM4 mode in the linearly operable range.

[First Modification]

Figure 7:
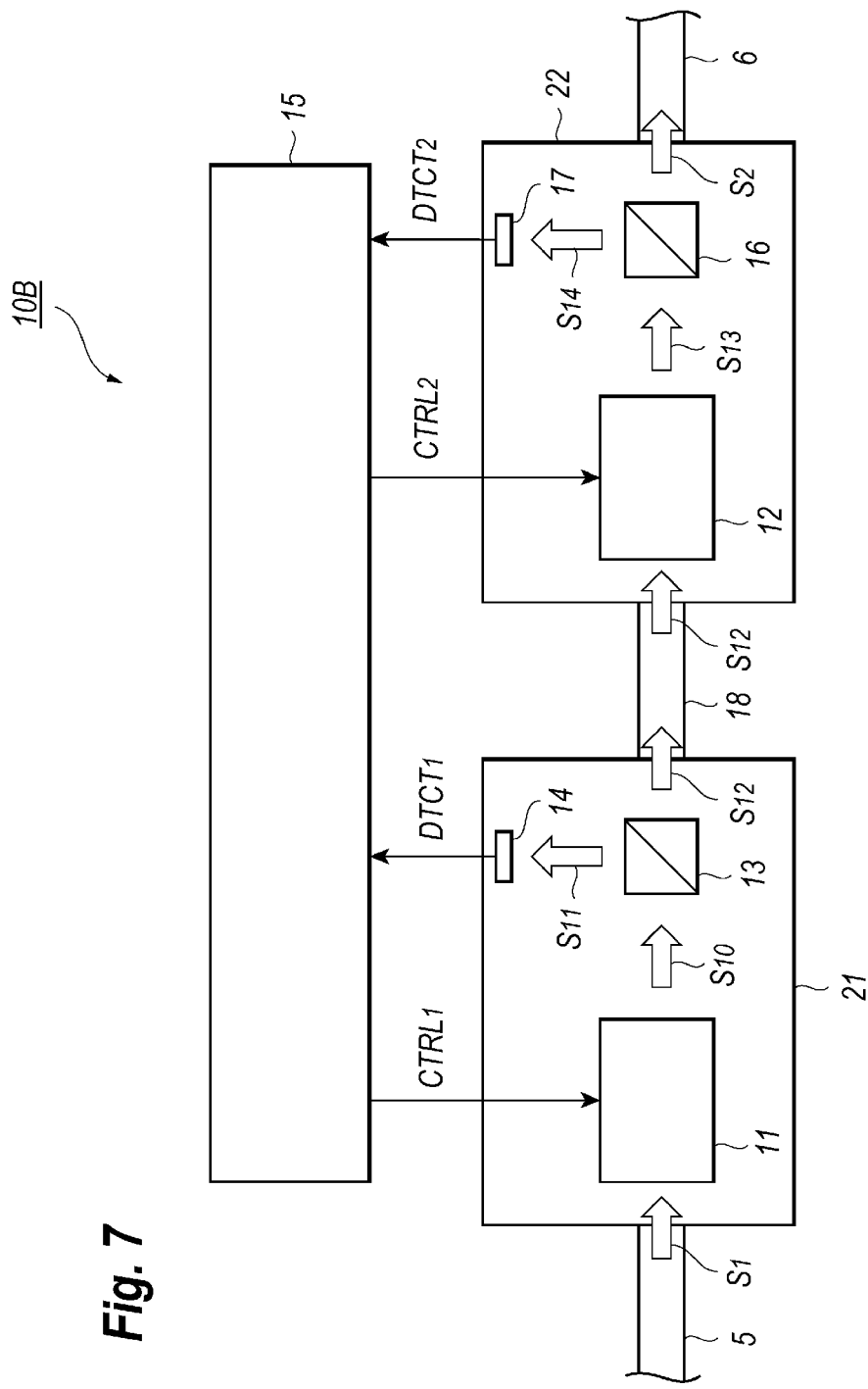
FIG. 7 shows a functional block diagram of another optical amplifying apparatus modified from the optical amplifying apparatus shown in FIG. 3.

FIG. 7 shows a functional block diagram of another optical amplifying apparatus 10B modified from that shown in FIG. 3. The optical amplifying apparatus 10B shown in FIG. 7 further provides another optical splitter 16 and another optical detector 17, where the optical splitter 16 is put between the SOA 12 and the optical fiber 6 to split the amplified optical signal $S_{13}$ output from the SOA 12 into two portions, $S_{14}$ and $S_2$, with a ratio for the former of 3 to 10%. The optical detector 17 detects the optical signal $S_{14}$ split by the optical splitter 16 and generates another detected signal $DTCT_2$ that corresponds to average power of the amplified optical signal $S_{13}$. In the present embodiment, the housing 22 may commonly enclose the optical splitter 16 and the optical detector 17 with the SOA 12. The controller 15 may adjust the optical gain in the SOA 12 such that the power of the amplified optical signal $S_{13}$ in the average thereof becomes constant.

The method of controlling the optical amplifying apparatus 10B shown in FIG. 7 has a feature distinguishable from those for the optical amplifying apparatus 10A that the SOA 12 is set with a variable optical gain thereof. That is, the amplified optical signal $S_{13}$ is detected in the average power thereof by the optical detector $S_{17}$ and the optical gain set in the SOA 12 may be adjusted such that the detected average optical power of the amplified signal $S_{13}$ is kept constant in a preset power. Thus, the optical signal $S_2$ output from the optical amplifying apparatus 10B may maintain the preset average power and resultantly the preset power differences between the respective physical levels in the PAM4 mode.

[Second Modification]

Figure 8:
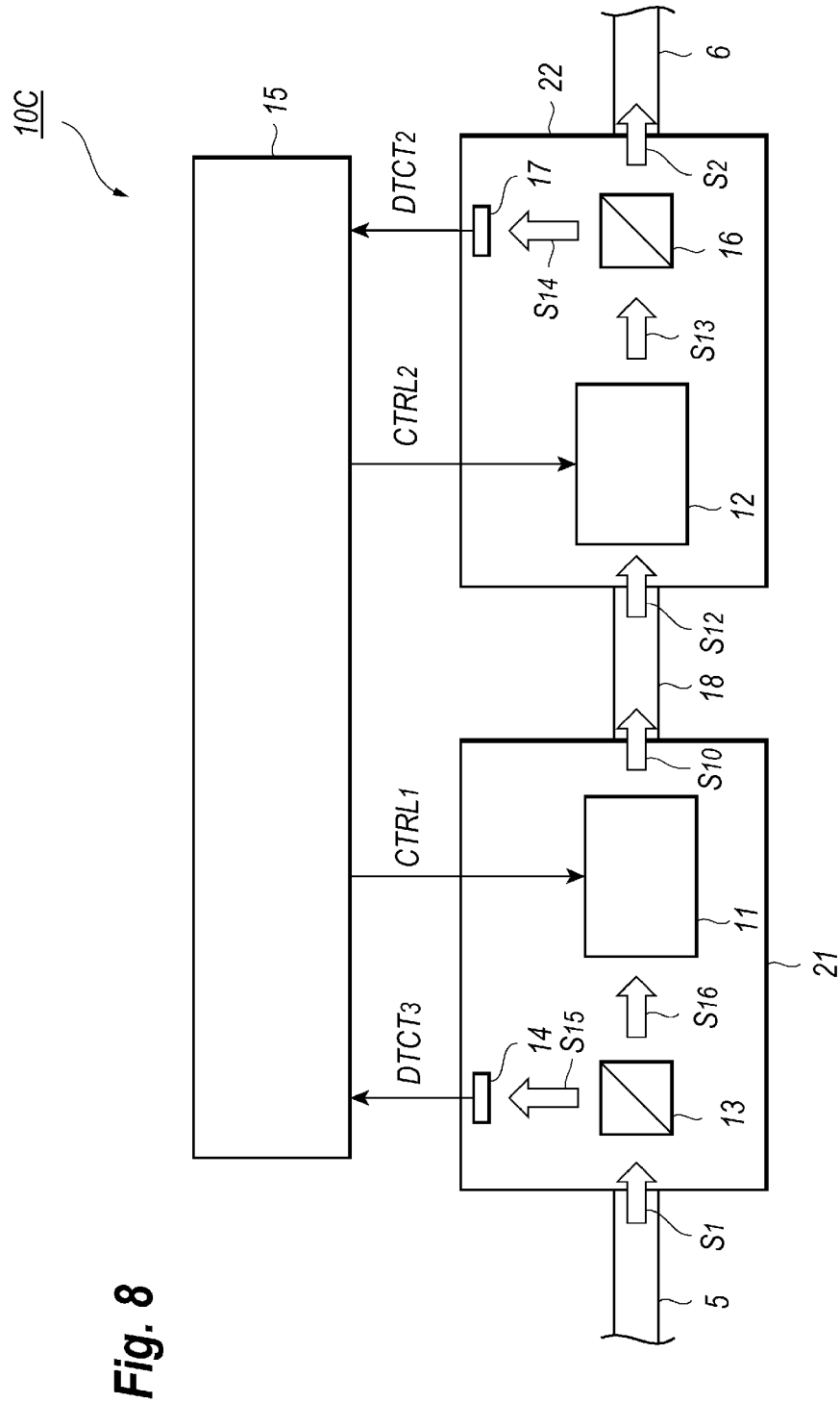
FIG. 8 shows a functional block diagram of still another optical amplifying apparatus also modified from the optical amplifying apparatus shown in FIG. 3.

FIG. 8 shows a functional block diagram of still another optical amplifying apparatus 10C that is also modified from the optical amplifying apparatus 10A shown in FIG. 3. The optical amplifying apparatus 10C has a feature distinguishable from those of the former two optical amplifying apparatuses, 10A and 10B, that the optical splitter 13 is put in front of the VOA 11, that is, the optical detector 14 detects the average power of the input signal $S_1$ through the optical signal $S_{15}$ split by the optical splitter 13 before entering the VOA 11. Specifically, the optical splitter 13 splits the optical signal $S_1$ provided from the optical fiber 5 into two portions, $S_{15}$ and $S_{16}$, where the former optical signal $S_{15}$ enters the optical detector 14, while, the latter is provided to the VOA 11. Thus, the optical detector 14 may detect the average power of the optical signals $S_1$ and provides the detected signal $DTCT_3$ to the controller 15. The optical amplifying apparatus 10C of the present embodiment also encloses the VOA 11, the optical splitter 13, and the optical detector 14 within the common housing 21. The controller 15 may adjust the attenuation in the VOA 11 based on the detected signal $DTCT_3$. Specifically, the controller 15 may decide the attenuation in the VOA 11 by steps of evaluating the optical loss from the optical transmitter 3 to the optical amplifying apparatus 10C, estimating the maximum power corresponding to the level 3 of the PAM4 mode from the detected average power and the evaluated optical loss, and deciding the attenuation of the VOA 11 such that the maximum power becomes the preset power for operating the SOA 12 in the linear range.

In the foregoing detailed description, the method and apparatus of the present invention have been described with reference to specific exemplary embodiments thereof. It will, however, be evident that further various modifications and changes may be made thereto without departing from the broader spirit and scope of the present invention. The present specification and figures are accordingly to be regarded as illustrative rather than restrictive.

What is claimed is:

1. A method of controlling an optical amplifying apparatus that receives an optical signal having four or more physical levels following a pulse amplitude modulation (PAM) mode, the optical amplifying apparatus including a variable optical attenuator (VOA) and a semiconductor optical amplifier (SOA), the method comprising steps of:
    generating an attenuated optical signal by attenuating the optical signal entering the optical amplifying apparatus such that the attenuated optical signal in maximum power of one of the physical levels thereof becomes a preset level by which the SOA is linearly operable; and
    amplifying the attenuated optical signal by the SOA with an optical gain,
    wherein the step of generating the attenuated optical signal includes steps of:
    detecting average power of the attenuated optical signal; and
    estimating the maximum power from the detected average power and a designed average power specified in the PAM mode.

2. The method according to claim 1,
    wherein the step of amplifying the attenuated optical signal is carried out by a fixed optical gain in the SOA.

3. The method according to claim 1,
    wherein the step of amplifying the attenuated optical signal includes steps of:
    detecting an amplified optical signal output from the SOA; and
    deciding the optical gain in the SOA such that the amplified optical signal shows preset average power.

4. A method of controlling an optical amplifying apparatus that receives an optical signal having four or more physical levels following a pulse amplitude modulation (PAM) mode, the optical amplifying apparatus including a variable optical attenuator (VOA) and a semiconductor optical amplifier (SOA), the method comprising steps of:
    generating an attenuated optical signal by attenuating the optical signal entering the optical amplifying apparatus such that the attenuated optical signal in maximum power of one of the physical levels thereof becomes a preset level by which the SOA is linearly operable; and
    amplifying the attenuated optical signal by the SOA with an optical gain,
    wherein the step of generating the attenuated optical signal includes steps of:
    detecting average power of the optical signal entering the optical amplifying apparatus; and
    estimating the maximum power from the detected average power and a designed average power specified in the PAM mode.

5. The method according to claim 4,
    wherein the step of amplifying the attenuated optical signal is carried out by a fixed optical gain in the SOA.

6. The method of according to claim 4,
    wherein the step of amplifying the attenuated optical signal includes steps of:
    detecting an amplified optical signal output from the SOA; and
    deciding the optical gain in the SOA such that the amplified optical signal shows preset average power.

7. A method of controlling an optical amplifying apparatus that receives an optical signal having four or more physical levels following a pulse amplitude modulation (PAM) mode, the optical amplifying apparatus including a variable optical attenuator (VOA) and a semiconductor optical amplifier (SOA), the method comprising steps of:
    generating an attenuated optical signal by attenuating the optical signal entering the optical amplifying apparatus such that the attenuated optical signal in maximum power of one of the physical levels thereof becomes a preset level by which the SOA is linearly operable; and
    amplifying the attenuated optical signal by the SOA with an optical gain,
    wherein the step of amplifying the attenuated optical signal includes steps of:
    detecting an amplified optical signal output from the SOA; and
    deciding the optical gain in the SOA such that the amplified optical signal shows preset average power.

* * * * *